CONTINUOUS METHOD OF MAKING INDEFINITE LENGTHS OF FLEXIBLE FLAT CONDUCTOR CABLE AND CIRCUITS

Filed July 7, 1967

3,562,036

CONTINUOUS METHOD OF MAKING INDEFINITE LENGTHS OF FLEXIBLE FLAT CONDUCTOR CABLE AND CIRCUITS

Lawrence R. Travis, Brockton, Mass., assignor to Electro Connective Systems, Inc., Brockton, Mass., a corporation of Massachusetts Filed July 7, 1967, Ser. No. 651,846
Int. Cl. B44c *1/22;* C23f *1/04*
U.S. Cl. 156—3 5 Claims

ABSTRACT OF THE DISCLOSURE

Method of depositing resist on a continuously moving web of conductor metal foil backed by flexible dielectric material wherein a resist pattern is deposited on the foil at one station and a different resist pattern is deposited on the foil at another station, from which web an indefinite length of flat flexible cable and circuits is formed by etching the foil, the selection of resist deposition being controlled by sensing of previously formed control indicia in the form of openings, such as notches or holes, located along the web at a predetermined transverse position on the web.

This application is related to application Ser. No. 651,899, filed of even date herewith.

This invention relates to manufacture of flexible flat conductor cables and circuits, and in particular provides a method for continuous manufacture of indefinite lengths of such flat conductor cable and circuits.

In the manufacture of flat conductor cable and circuits in continuous web form, a conductor metal foil, e.g., copper foil, is first provided with a backing of dielectric material on one side of the foil by laminating, spray coating, offset coating or other procedure. A resist material having the same configuration as that of the desired conductor pattern is then deposited on the unbacked side of the foil, possibly after cleaning such side. Screen process and photo resist techinques are commonly used for the purpose but result in a "step-and-repeat" operation, i.e., intermittent travel of the web. Techniques have been proposed for continuous printing of printed circuit boards and for continuously depositing parallel lines of resist in forming flat cable. To date, however, it has not been possible to provide continuous depositing of indefinite lengths of parallel lines of resist interrupted in accordance wtih a predetermined regular or irregular sequence by non-parallel resist patterns, typically for providing terminations for such parallel lines.

It is thus a principal object of this invention to provide a method for depositing resist on a web of dielectric-backed conductor metal foil in a completely continuous manner which permits production of indefinite lengths of such web having resist patterns including:

(1) parallel conductors for flat cable,
(2) non-parallel, discrete configuration conductor for flexible circuits, and
(3) special cables, the bulk area of which have parallel conductors, having special non-parallel ends or branches.

In this field there are many techniques known for depositing resist. Generally, for the purposes of this invention any technique capable of continuously depositing the resist in which lateral dimensions (dimensions across the web) can be held stable with reference to an edge of the web (or other laterally fixed longitudinal path along the web) can be used. The preferred techniques include printing an ink resist by printing rollers. In this event it is preferred to use rotogravure rolls for printing parallel lines and offset rolls for non-parallel circuits.

In accordance with the instant invention a continuous longitudinally aligned regular (parallel lines) pattern is applied at one resist printing station and a short length irregular (non-parallel lines) pattern is applied at a second printing station. The printing sequence of the stations is triggered by the web. Control indicia are formed on the web by deformation, trimming or cutting the web along a path on the web having a predetermined transverse location, e.g., along an edge of the web. The reference indicia are sensed by surveillance of the web as it moves toward the printing stations. The web may then be processed in the usual fashion with drying the printed resist, etching, application of an electrical insulation coating and then coiling and severing into desired cable lengths. For a more complete understanding of the practical application of this invention, reference is made to the appended drawing, in which:

Figures 1, 2, 3, 4, 5:
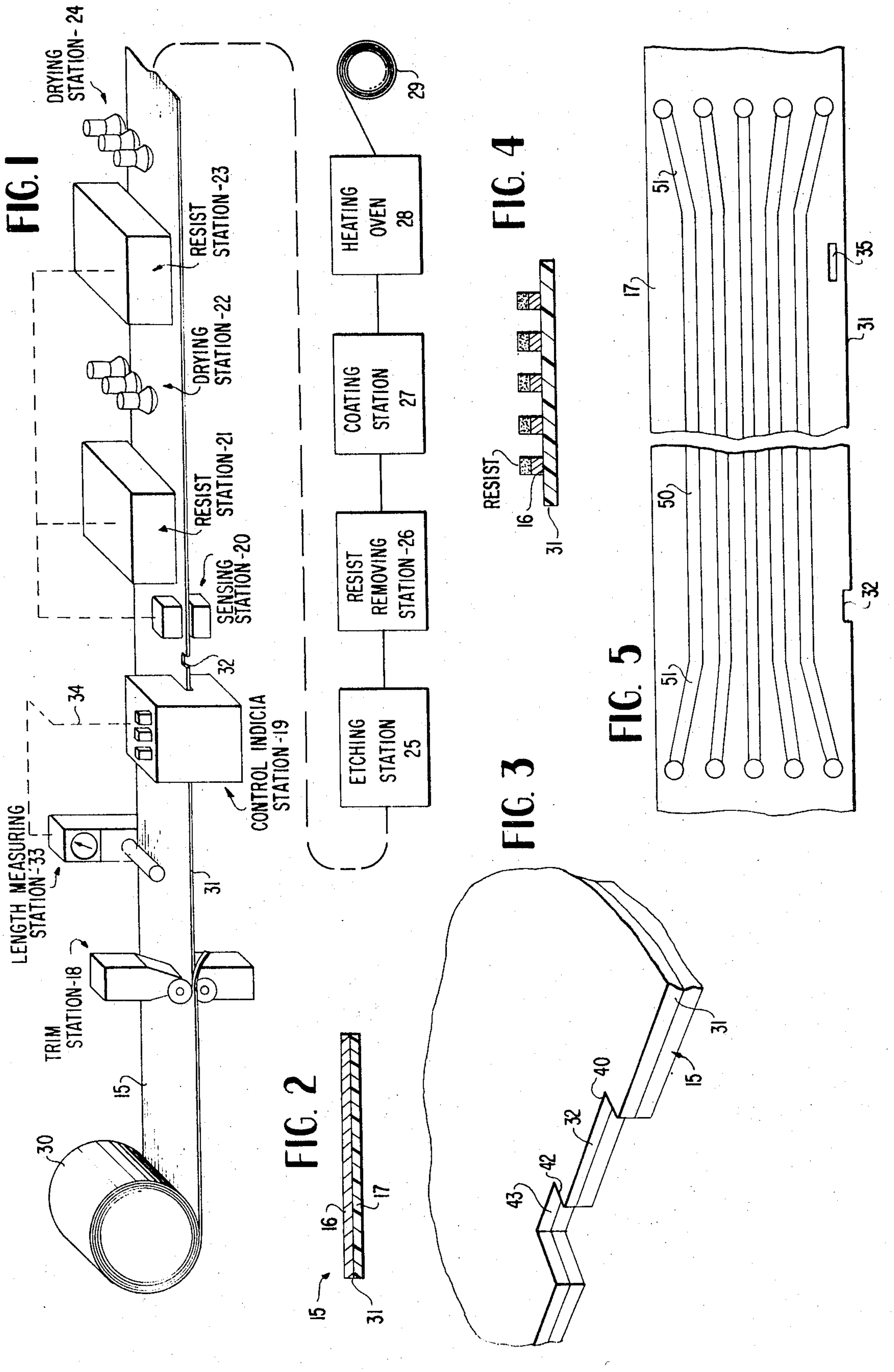
FIG. 1 is a schematic flow diagram of the steps of the method.
FIG. 2 is a cross-sectional view of the web prior to resist application.
FIG. 3 is a perspective view showing control indicia on an enlarged scale.
FIG. 4 is a cross-sectional end view of the processed web as it appears on leaving the etching station.
FIG. 5 is a plan view of the web showing regular intermediate bands of indefinite length with terminal end portions thereof being spread out to facilitate electrical connections.

Referring now to FIGS. 1 and 2, it will be seen that web 15 has a top conductor metal foil layer 16 and a bottom electrical insulation or dielectric material layer 17. Web 15 is fed through a trim station 18, a control indicia station 19, a sensing station 20, the first resist station 21, its associated dryer 22, through the second resist station 23 and its associated dryer 24, and then to further treatment stations including the etching station 25 and resist removing station 26, the coating station 27 and its heating oven 28, and the coiling station 29. A cable cutting device can be substituted for the coiling station, if so desired, with the discrete cables being stacked at the discharge end of the line.

While some systems might include the production of the two ply web 15, the system shown in FIGS. 1 and 2 utilizes a roll 30 of a previously formed two ply flexible web.

Preferably, the web 15 is passed through the longitudinal edge trimming station 18 which may be of any suitable design for accurately cutting the web border to produce a longitudinal reference edge 31 along the web which can be sensed to produce accurate transverse alignment of the web by suitable mechanisms as it travels through the control indicia station 19, sensing station 20 and resist applying stations 21 and 23.

The control indicia station 19 physically changes portions of the web to form reference indicia 32 along the web 15 at precisely positioned transverse locations with respect to the previously trimmed longitudinal reference edge 31.

Precise longitudinal positioning of the indicia 32 along the web may be accomplished by various techniques, such as, measurement of predetermined lengths of web as the web moves to the control indicia station 19, reliance on a cam-type actuation connected to the web drive system for control indicia station actuation or the like. In the system shown, a length measuring station 33 is provided before the control indicia station 19 and when a predetermined length of web has passed, a signal is sent through control line 34 to cause a physical change in the web at the control indicia station 19. It will be understood that the length measuring station 33 can be programmed to measure and signal the passage of extremely long as well as short lengths of web to enable the production of various types and lengths of discrete cables. Further, while the control indicia station 19 is shown as forming edge notches 32 or longitudinal slits 35 positioned transversely inwardly from the longitudinal reference edge 31 as shown in FIG. 5, other forms of physical change to the web can be utilized, such as, dents, deformations, and the like.

After passing through the control indicia station 19, the web is passed through a sensing station 20 which, in accordance with previous programming, responds to the control indicia 32 or 35 to set up the application of resist by the first resist station 21 and/or the second resist station 23. It will be understood that any length of web can be processed in this fashion, the first resist application being an elongated regular or first pattern and the second resist application being a short length irregular or different pattern. FIG. 5 shows a cable having parallel bands of a regular first pattern 50 terminated at each end by a different pattern 51 which spreads the ends of the electrically conducting bands to facilitate electrical connections.

Preferably, the first resist station 21 is of the rotogravure type employing a roller which prints longitudinally aligned regular wire identifying bands. The second resist station 23 is, preferably, of the replaceable impression plate-offset roller type.

When the desired web length has passed through resist station 21, a control indicia 32 or 35 is sensed at the sensing station 20 and, in proper timed sequence, the rotogravue roller of resist station 21 is raised from printing position and an offset roller in the other resist station 23 is moved into precise alignment with the ends of the aligned printed bands to joint to and add a short length irregular pattern. Preferably, a replaceable master or impression plate is wrapped around the offset roller for printing this short length pattern. Such plates are somewhat low in cost and can be readily changed when a different irregular pattern is desired. The gap between the ends of the plate can produce a gap on the web and this can become the end of a cable. If desired, the impression plate can carry a pattern for the trailing end of one cable and the leading end of the following cable. The sensing station 20 will also cause the rotogravure roller at resist station 21 to move back into printing position at the proper position on the web to insure accurate registration of the forward irregular pattern with the regular pattern formed thereby. Suitable timing and control systems known in the art can be utilized to accomplish these functions.

After each resist application the web is passed through drying stations 22 and 24, respectively.

The resultant dried web is then passed through the etching station 25 to remove the metal foil layer not covered by resist. FIG. 4 shows the web following this step. Then the web is passed through the resist removing station 26 where the resist is removed to expose the remaining metal foil layer.

The web can then be processed further through the coating station 27 where a dielectric material is placed on the metal foil layer, through a heating oven 28 for curing or drying the dielectric material, and then to the coiling station 29.

The control indicia have been described as being provided by physically deforming or changing portions of the web 15 in precise relationship to a longitudinal reference, namely the longitudinal reference edge 31. It will be understood that both resist stations 21 and 23 could be depositing resist at the same time under certain production arrangements and that this requirement can be met by a predetermined code for slits or notches in the web. As seen in FIG. 3, for example, a leading substantially transverse edge 40 of a notch 32 may control the first resist station 21 while a transverse edge 42 (FIG. 3) of a second notch 43 connected to the first notch 32 may be used to control the second resist station 23. It will be understood that the sensing of these edges 40 and 42 need not necessarily cause an immediate response of the mechanisms in the resist stations and that time delay devices can be used for programming the final transmission of such signals.

The method is continuous and enables the production of flexible flat conductor cable and circuits of any length. The short length irregular or indifferent pattern may involve a spreading of the ends of the long conductors to facilitate connection thereto or may involve complex circuits.

I claim:

1. A method of continuously producing indefinite lengths of flexible cables and circuits from a flexible web which has a conductor metal foil layer and a dielectric material layer disposed on one side of said foil layer, comprising:

(a) continuously moving the web through a predetermined path;

(b) longitudinally trimming the web to provide a longitudinal reference edge;

(c) physically changing portions of the web in a predetermined manner to provide control indicia at predetermined longitudinal locations along the web and at predetermined transverse locations on the web with respect to said longitudinal reference edge;

(d) sensing said longitudinal reference edge of the web;

(e) sensing said control indicia;

(f) thereafter applying resist to the metal foil layer selectively at two stations while continually maintaining the web in transverse alignment with the stations as the web travels longitudinally therethrough in response to said sensing of said longitudinal reference edge;

(g) selectively applying resist application in a predetermined sequence responsive to the sensing of said indicia to produce an elongated first pattern of resist at one of said stations and to produce a short length different pattern at the other of said stations thereby continuously to produce lengths of web having an elongated first resist pattern and a contiguous connected short length different resist pattern;

(h) removing by etching the portion of the metal foil layer not covered by resist; and (i) removing the resist pattern to expose the remaining metal foil layer.

2. A method as defined in claim 1 and wherein said resist application at the first station is accomplished by rotogravure, producing said elongated first pattern in the form of longitudinally aligned wire identifying bands.

3. A method as defined in claim 2 and wherein said resist application at said second station is accomplished by replaceable impression plate-offset roller printing producing said different pattern in the form of a non-aligned wire identifying design.

4. A method as defined in claim 1 and wherein physically changing portions of the web produces open notches along the longitudinal reference edge with the control indicia being provided by a substantially transverse edge of each notch.

5. A method as defined in claim 1 and wherein physically changing portions of the web produces holes in the web with the control indicia being provided by a substantially transverse edge of each hole.

References Cited

UNITED STATES PATENTS

| | | | |
|---|---|---|---|
| 2,840,370 | 6/1958 | Noble | 226—28 |
| 3,237,973 | 3/1966 | Rumberger | 29—625 |
| 3,423,260 | 1/1969 | Heath et al. | 156—3 |
| 3,442,001 | 5/1969 | Canteloube | 29—407 |
| 3,449,813 | 6/1969 | Tregubenko | 29—625 |
| 3,455,751 | 7/1969 | Frantzen | 156—3 |

ROBERT F. BURNETT, Primary Examiner

R. J. ROCHE, Assistant Examiner

U.S. Cl. X.R.

156—8, 47; 118—7; 101—177; 226—15